US011107688B2

(12) United States Patent
Liu

(10) Patent No.: US 11,107,688 B2
(45) Date of Patent: Aug. 31, 2021

(54) SEMICONDUCTOR DEVICE MANUFACTURING METHOD

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fu Hai Liu, Shanghai (CN)

(73) Assignees: SEMICONDUCTOR MANUFACTURING INTERNATIONAL (SHANGHAI) CORPORATION; SEMICONDUCTOR MANUFACTURING INTERNATIONAL (BEIJING) CORPORATION

( * ) Notice: Subject to any disclaimer, the term of this patent is extended or adjusted under 35 U.S.C. 154(b) by 0 days.

(21) Appl. No.: 16/240,168

(22) Filed: Jan. 4, 2019

(65) Prior Publication Data

US 2019/0221430 A1 Jul. 18, 2019

(30) Foreign Application Priority Data

Jan. 12, 2018 (CN) ........................ 201810028549.X

(51) Int. Cl.

*H01L 21/265* (2006.01)
*H01L 29/78* (2006.01)
*H01L 29/66* (2006.01)

(52) U.S. Cl.

CPC .. *H01L 21/26506* (2013.01); *H01L 21/26586* (2013.01); *H01L 29/66795* (2013.01); *H01L 29/7851* (2013.01); *H01L 29/7855* (2013.01)

(58) Field of Classification Search

CPC ................................................ H01L 21/26586
See application file for complete search history.

(56) References Cited

U.S. PATENT DOCUMENTS 5,426,063 A * 6/1995 Kaneko ............. H01L 21/26586 257/E21.345
5,686,324 A * 11/1997 Wang ................ H01L 21/26586 257/E21.345

(Continued)

FOREIGN PATENT DOCUMENTS

CN 107452627 A 12/2017

OTHER PUBLICATIONS

First Office Action for Chinese Application No. 201810028549.X, dated Sep. 3, 2020, pp. 1-8.

*Primary Examiner* — Christopher A Johnson
(74) *Attorney, Agent, or Firm* — Innovation Counsel LLP

(57) ABSTRACT

A semiconductor device manufacturing method is presented. The manufacturing method includes: providing a semiconductor structure, wherein the semiconductor structure comprises a semiconductor substrate, a first doped region in the semiconductor substrate, and a first gate structure on the first doped region; forming a source and a drain in the first doped region on two opposing sides of the first gate structure; and implanting dopants to the source and the drain by an ion implantation process, wherein the implantation direction and an upper surface of the first doped region form an acute angle, the dopants implanted to the source and the drain have the same conductivity type as that of the source and the drain. In this method, the dopants are implanted at an acute (Continued)

angle, they improve the drain current of a transistor, and thus improve the performance of a semiconductor device.

11 Claims, 4 Drawing Sheets

(56) References Cited

U.S. PATENT DOCUMENTS

| | | | | |
|---|---|---|---|---|
| 6,362,062 | B1 * | 3/2002 | Nandakumar | H01L 21/26586 257/344 |
| 2001/0036713 | A1 * | 11/2001 | Rodder | H01L 21/2652 438/514 |
| 2008/0029830 | A1 * | 2/2008 | Tsai | H01L 29/0646 257/408 |
| 2013/0196495 | A1 * | 8/2013 | Flachowsky | H01L 21/823807 438/585 |
| 2016/0315013 | A1 * | 10/2016 | Tokita | H01L 29/6656 |

* cited by examiner

SEMICONDUCTOR DEVICE MANUFACTURING METHOD

CROSS-REFERENCE TO RELATED APPLICATION

This application claims priority to and benefit of Chinese Patent Application No. 201810028549.X filed on Jan. 12, 2018, which is incorporated herein by reference in its entirety.

BACKGROUND

(a) Field of the Invention

This inventive concept relates to semiconductor technologies and, more specifically to a semiconductor device manufacturing method.

(b) Description of the Related Art

Compared to an N-type Metal-Oxide-Semiconductor (NMOS) transistor, a P-type Metal-Oxide-Semiconductor (PMOS) transistor has a lower hole mobility, therefore a PMOS transistor has a lower transconductance than an NMOS transistor of the same size and working voltage. In a conventional semiconductor manufacturing process, a silicon-germanium (SiGe) process is typically used to improve the hole mobility of a PMOS transistor. In the SiGe process, regular source/drain regions are replaced with SiGe source/drain regions that have larger stress. In this process, regular source/drain regions will be etched away, and SiGe will be epitaxially grown in the resulted cavities to form SiGe source/drain regions. If a PMOS transistor has sufficiently wide source/drain regions, like the SA205 transistor whose source/drain regions are 205 nm wide, its source/drain regions may comprise "full" SiGe. On the other hand, if a PMOS transistor does not have sufficiently wide source/drain regions, like the SA75 transistor whose source/drain regions are only 75 nm wide, its source/drain regions may comprise "half" SiGe. Since SiGe is epitaxially grown on a silicon surface, and there is no silicon surface on the Shallow Trench Isolation (STI) adjacent to the source/drain regions of the SA75 transistor, there is no SiGe grown in the STI area. The source/drain regions with "half" SiGe may have less stress and slower carrier mobility compared to those with "full" SiGe. For example, since a SA75 transistor has less SiGe volume than a SA205 transistor, a drain current ($I_{dsat}$) in a SA75 transistor may be 20%-30% lower than its counterpart in a SA205 transistor, this deficiency may lead to mismatch between a transistor and a wafer. Thus, a semiconductor device manufacturing method that can remedy this limitation is desirable.

SUMMARY

Based on the investigations on the limitations of conventional manufacturing methods, this inventive concept presents a semiconductor device manufacturing method that remedies at least some limitations in the conventional manufacturing methods.

This inventive concept first presents a semiconductor device manufacturing method, comprising:

providing a semiconductor structure, wherein the semiconductor structure comprises a semiconductor substrate, a first doped region in the semiconductor substrate, and a first gate structure on the first doped region;

forming a source and a drain in the first doped region on two opposing sides of the first gate structure; and implanting dopants to the source and the drain by an ion implantation process, wherein the implantation direction and an upper surface of the first doped region form an acute angle, the dopants implanted to the source and the drain have the same conductivity type as that of the source and the drain.

Additionally, in the aforementioned manufacturing method, the semiconductor structure may further comprise: a second doped region separated from the first doped region, and a trench isolation between the first and the second doped regions, wherein one of the source or the drain is located at a boundary of the first doped region near the trench isolation, and the dopants may be implanted in a direction orthogonal to a slanted surface of the source or the drain at the boundary of the first doped region near the trench isolation, the slanted surface forming an obtuse angle with the upper surface.

Additionally, in the aforementioned manufacturing method, the acute angle between the implantation direction and the upper surface of the first doped region may be in a range of 0-30 degree.

Additionally, in the aforementioned manufacturing method, the semiconductor structure may further comprise: a second gate structure on the second doped region, and a hard mask layer covering the second doped region and the second gate structure, and the manufacturing method may further comprise:

removing the hard mask layer after the ion implantation process is completed.

Additionally, in the aforementioned manufacturing method, the dopants implanted to the source and the drain may comprise boron or boron difluoride.

Additionally, in the aforementioned manufacturing method, forming a source and a drain in the first doped region on two opposing sides of the first gate structure may comprise:

forming a first cavity and a second cavity in the first doped region on two opposing sides of the first gate structure; and epitaxially growing the source and the drain in the first cavity and the second cavity, respectively.

Additionally, in the aforementioned manufacturing method, the source and the drain may have an opposite conductivity type to that of the first doped region. For example, the conductivity type of the first doped region may be N type, and the conductivity type of the dopants may be P type.

Additionally, in the aforementioned manufacturing method, the trench isolation may comprise: a trench located between the first doped region and the second doped region, and a trench isolation material filling the trench, and the first doped region may have an opposite conductivity type to that of the second doped region.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
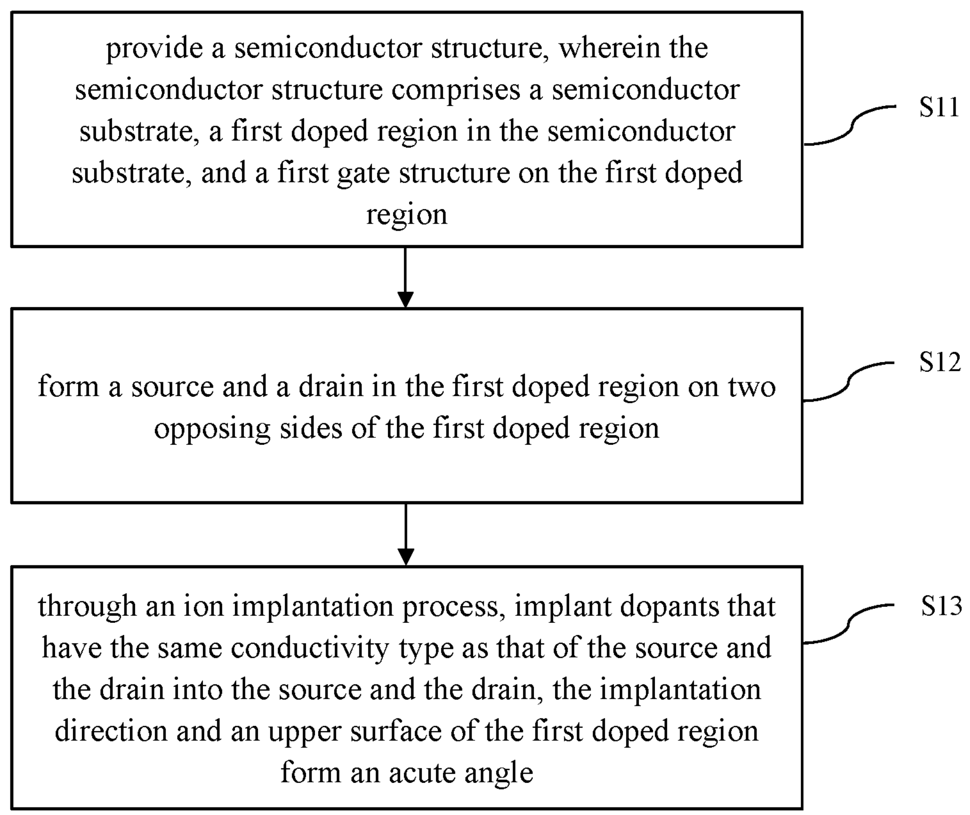
FIG. 1 shows a flowchart illustrating a semiconductor device manufacturing method in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a semiconductor device manufacturing method in accordance with one embodiment of this inventive concept. FIGS. 2, 3, 4, and 5 show cross-sectional views illustrating different stages of this semiconductor device manufacturing method. This semiconductor device manufacturing method will be described below with reference to these drawings.

Referring to FIG. 1, in step S11, a semiconductor structure is provided, the semiconductor structure comprises a semiconductor substrate, a first doped region in the semiconductor structure, and a first gate structure on the first doped region.

Figure 2:
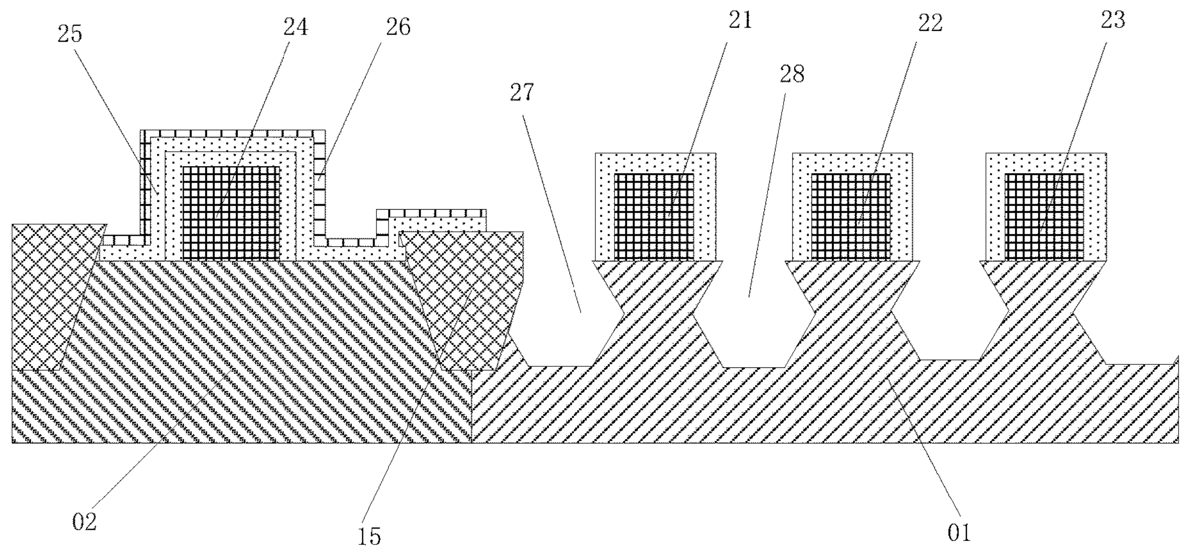
FIGS. 2, 3, 4, and 5 show cross-sectional views illustrating different stages of a semiconductor device manufacturing method in accordance with one embodiment of this inventive concept.

Referring to FIG. 2, the semiconductor substrate (e.g., a silicon substrate) may comprise a first doped region 01. The conductivity type of the first doped region 01 may be N type. A plurality of first gate structures 21, 22, 23 may be formed on the first doped region 01, and a dielectric layer may be formed around the first gate structures 21, 22, 23. The gate may be formed by manufacturing processes that are well known to persons of ordinary skills in this field, for example, by a High-K Metal Gate (HKMG) manufacturing process. Then an etching process may be applied on the first doped region 01 to remove the substrate material in source/drain regions. For example, referring to FIG. 2, after the etching process, a first cavity 27 and a second cavity 28 may be formed on two opposing sides of the first gate structure 21.

Referring to FIG. 2, in one embodiment, the semiconductor structure in step S11 may further comprise: a second doped region 02 separated from the first doped region 01, and a trench isolation 15 between the first doped region 01 and the second doped region 02. The second doped region 02 may have an opposite conductivity type to that of the first doped region 01.

In one embodiment, the semiconductor structure may further comprise: a second gate structure 24 on the second doped region 02, and a hard mask layer 26 covering the second doped region 02 and the second gate structure 24.

The hard mask layer 26 may comprise silicon nitride, and a separation layer 25 (e.g., a silicon dioxide layer) may be formed between the hard mask layer 26 and the second doped region 02, and between the hard mask layer 26 and the second gate structure 24. In step S12, a source and a drain may be formed in the first doped region 01 on two opposing sides of the first gate structure 21.

Figure 3:
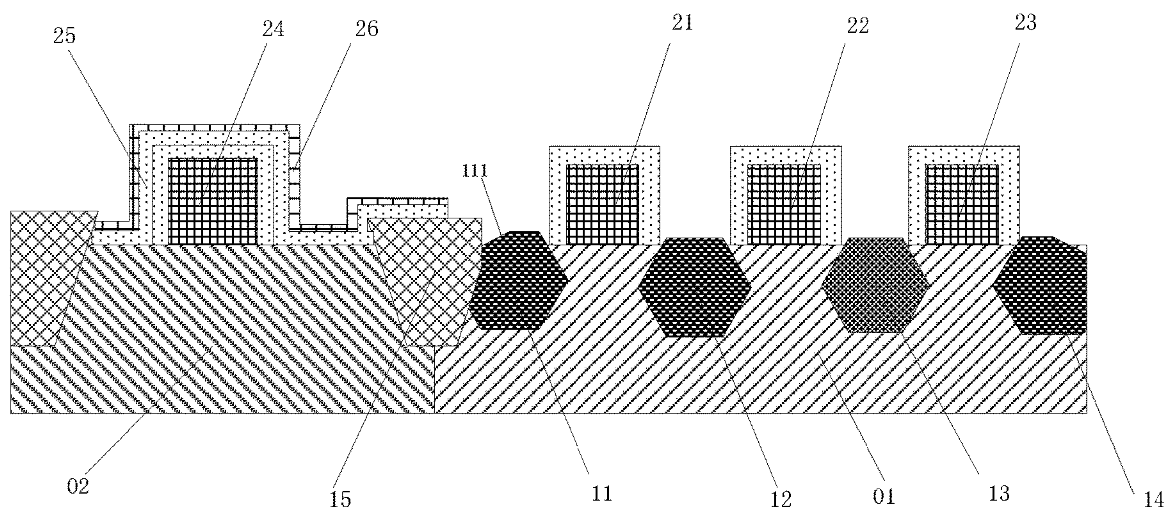

Referring to FIG. 3, sources 11, 13 and drains 12, 14 may be formed in the first doped region 01 on two opposing sides of the first gate structures 21, 22, 23. For example, a source 11 and a drain 12 may be epitaxially grown in the first cavity 27 and the second cavity 28, respectively. The sources 11, 13 and the drains 12, 14 may have an opposite conductivity type to that of the first doped region 01.

When forming the source and the drain in the first doped region 01, a source or a drain may be formed at the boundary of the first doped region 01 near the trench isolation 15. For example, in FIG. 3, a source 11 is formed at the boundary of the first doped region 01 near the trench isolation 15.

In step S13, dopants that have the same conductivity type as that of the source and the drain are implanted to the source and the drain by an ion implantation process. The implantation direction and an upper surface of the first doped region form an acute angle.

Figure 4:
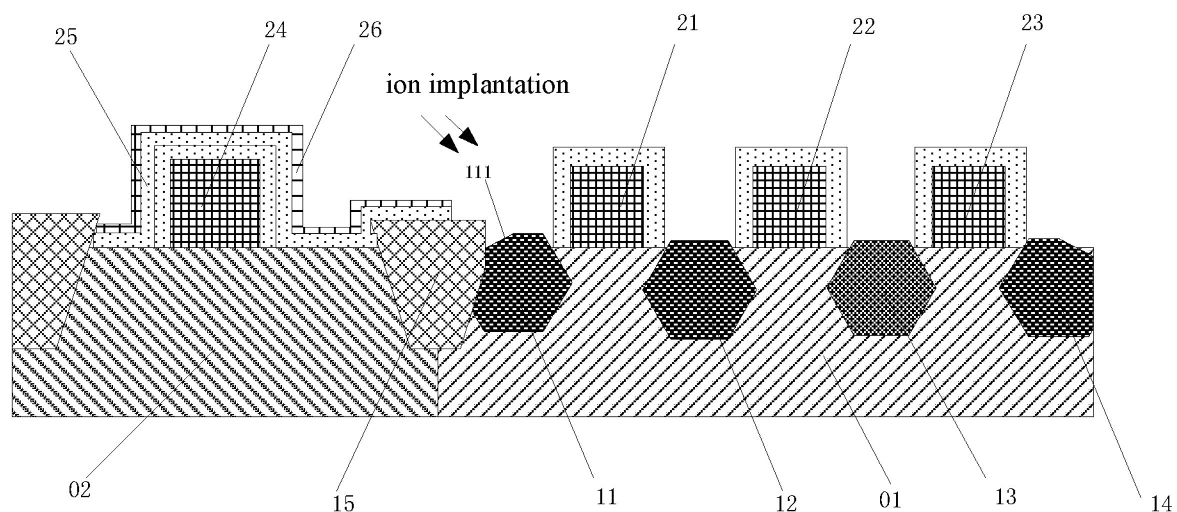

Referring to FIG. 4, the dopants that have the same conductivity type as that of the source and the drain are implanted to the sources 11, 13 and the drains 12, 14 by an ion implantation process, and the implantation direction and the upper surface of the first doped region 01 form an acute angle.

In some embodiments, the semiconductor device formed by the semiconductor device manufacturing method of this inventive concept may be a PMOS transistor, and may be a planar device. Ion implantation at a tilted angle helps to increase the drain current of the PMOS transistor. For example, the tilted ion implantation may increase the drain current of a SA75 PMOS transistor to a level that is similar to that of a SA205 PMOS transistor.

Referring to FIG. 4, the direction of ion implantation is approximately orthogonal to a slanted surface 111 of the source 11 at the boundary of the first doped region 01 near the trench isolation 15. The angle between the implantation direction and the upper surface of the first doped region 01 may be acute, for example in a range of 0-30 degrees. The dopants implanted at the source and the drain may comprise boron or boron difluoride. After the ion implantation process, a channel region of the PMOS transistor has the highest dopant concentration. The slanted surface 111 forms an obtuse angle with the upper surface of the first doped region, as shown in FIG. 4.

Figure 6:
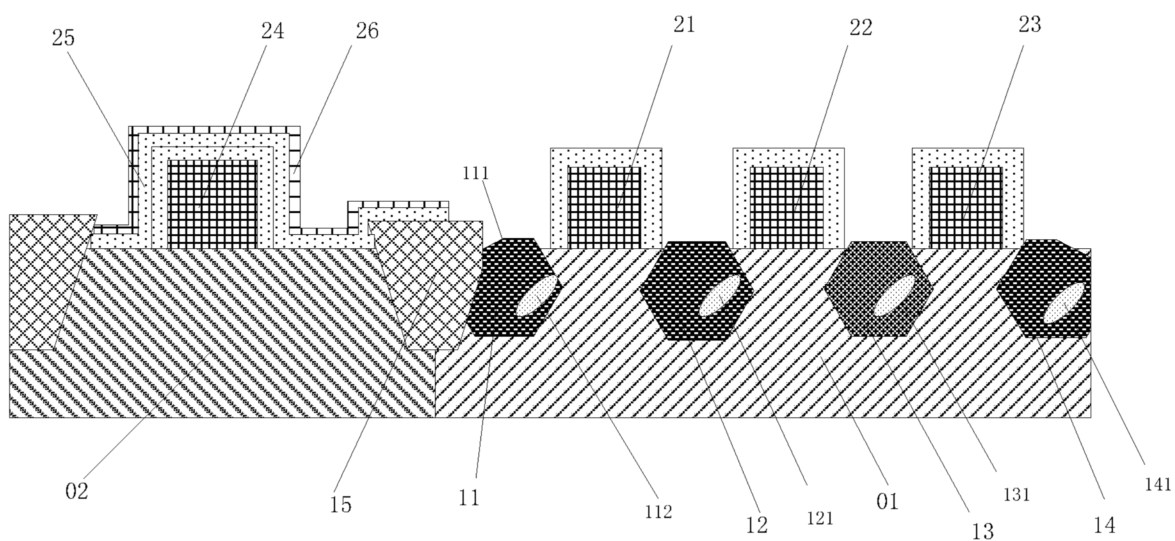
FIG. 6 shows a cross-sectional view illustrating a semiconductor structure after an ion implantation process in accordance with one embodiment of this inventive concept.

In one embodiment, the dopant that is implanted at the sources 11, 13 and the drains 12, 14 may be boron. Referring to FIG. 6, after the boron implantation, boron regions 112, 121, 131, 141 are formed in the sources 11, 13 and the drains 12, 14, respectively. Compare with other boron regions, the boron region 112 in the source 11 is formed at a deeper location and is closer to the channel region of the PMOS transistor.

The boron region 121 in the drain 12 is formed at a shallower location and further away from the channel region of the PMOS transistor than the boron region 112. Thus, for the same implantation concentration, the implantation on the drain 12 has a stronger effect in improving the drain current of the PMOS transistor and increasing the SiGe stress than the implantation on the source 11. The implantation helps to compensate the stress difference between the source 11 at the boundary of the first doped region 01 and the drain 12 at the interior of the first doped region 01.

Figure 5:
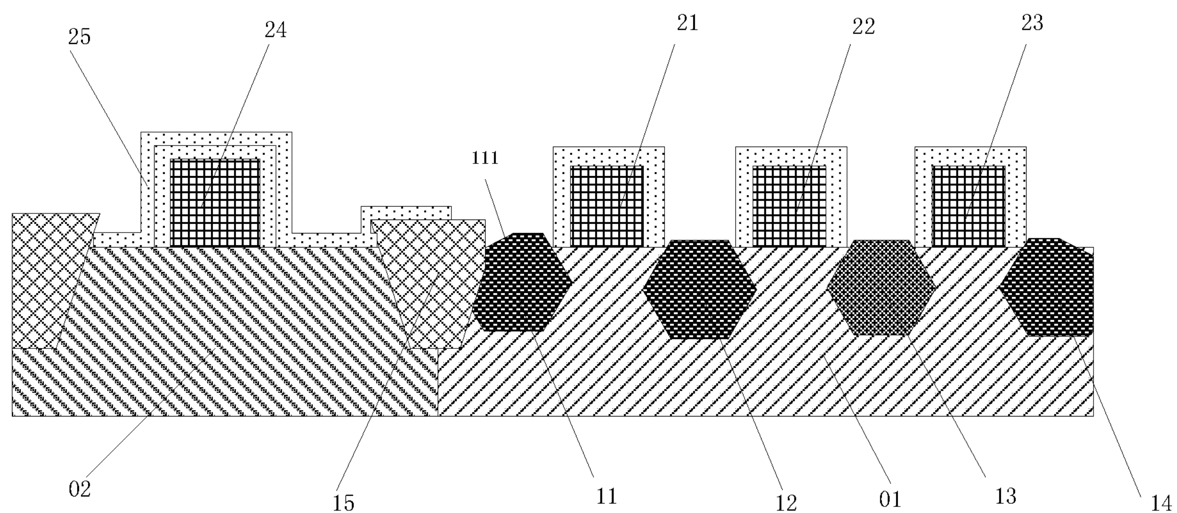

Next, referring to FIG. 5, the hard mask layer 26 may be removed after the ion implantation is completed.

In the semiconductor device manufacturing method described above, a source and a drain are formed in the first doped region on two opposing sides of the first gate structure, and dopants that have the same conductivity type as that of the source and the drain are implanted to the source and the drain, the implantation direction and the upper surface of the first doped region form an acute angle. Due to the acute angle of the ion implantation, the implanted ions can increase the drain current of the PMOS transistor and improve the performance of the semiconductor device.

This concludes the description of a semiconductor device manufacturing method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:

providing a semiconductor structure, wherein the semiconductor structure comprises a semiconductor substrate, a first doped region in the semiconductor substrate and a first gate structure on the first doped region;

forming a source and a drain in the first doped region on two opposite sides of the first gate structure; and implanting dopants in an implantation direction to the source and the drain by an ion implantation process, wherein the implantation direction is orthogonal to a slanted face of the source or the drain, and wherein the slanted face of the source or the drain directly contacts a lateral face of the trench isolation and is slanted relative to the lateral face of the trench isolation.

2. The manufacturing method of claim 1, wherein an angle between the implantation direction and an upper surface of the first doped region is in a range of 0-30 degrees.

3. The manufacturing method of claim 1, wherein the semiconductor structure further comprises: a second gate structure on a second doped region, and a hard mask layer covering the second doped region and the second gate structure, and wherein the manufacturing method further comprises: removing the hard mask layer after the ion implantation process is completed.

4. The manufacturing method of claim 1, wherein the dopants implanted to the source and the drain comprise boron or boron difluoride.

5. The manufacturing method of claim 1, wherein forming a source and a drain in the first doped region on two opposite sides of the first gate structure comprises: forming a first cavity and a second cavity in the first doped region on two opposing sides of the first gate structure; and epitaxially growing the source and the drain in the first cavity and the second cavity, respectively.

6. The manufacturing method of claim 5, wherein the source and the drain have an opposite conductivity type to that of the first doped region.

7. The manufacturing method of claim 1, wherein the conductivity type of the first doped region is N type, and the conductivity type of the dopants is P type.

8. The manufacturing method of claim 1, wherein the semiconductor structure further comprises: a second doped region, a trench located between the first doped region and the second doped region, and isolation material filling the trench.

9. The manufacturing method of claim 8, wherein the first doped region has an opposite conductivity type to that of the second doped region.

10. The manufacturing method of claim 1, wherein the dopants are implanted in the implantation direction to both the source and the drain, wherein the implantation direction and an upper surface of the first doped region form an acute angle, and wherein the dopants implanted to the source and the drain have the same conductivity type as that of the source and the drain.

11. A semiconductor device manufacturing method, comprising:

providing a semiconductor structure, wherein the semiconductor structure comprises a semiconductor substrate, a first doped region in the semiconductor substrate and a first gate structure on the first doped region;

forming a source and a drain in the first doped region on two opposite sides of the first gate structure; and implanting dopants to the source and the drain by an ion implantation process, wherein the ion implantation process results in a first implanted region in the source, results in a second implanted region in the drain, results in a first intervening region in the source and between the first implanted region and the first gate structure after the ion implantation process, and results in a second intervening region in the drain and between the second implanted region and the first gate structure after the ion implantation process, wherein a boundary between the first intervening region and the first implanted region is positioned closer to the first gate structure than a boundary between the second intervening region and the second implanted region is, and wherein an implantation concentration of the first implanted region is equal to an implantation concentration of the second implanted region and is greater than each of an implantation concentration of the first intervening region and an implantation concentration of the second intervening region.

* * * * *